(12) United States Patent
Dong et al.

(10) Patent No.: US 10,177,777 B2
(45) Date of Patent: Jan. 8, 2019

(54) DUAL-SENSOR SIGNAL COLLECTING CIRCUIT

(71) Applicant: Qingdao GoerTek Technology Co., Ltd., Qingdao, ShanDong (CN)

(72) Inventors: Kun Dong, ShanDong (CN); Jiajin Zhan, ShanDong (CN); Chenbin Fu, ShanDong (CN); Litang Chen, ShanDong (CN); Xiaojian Liu, ShanDong (CN)

(73) Assignee: Qingdao GoerTek Technology Co., Ltd., Qingdao (CN)

( * ) Notice: Subject to any disclaimer, the term of this patent is extended or adjusted under 35 U.S.C. 154(b) by 0 days.

(21) Appl. No.: 15/769,676

(22) PCT Filed: Dec. 23, 2016

(86) PCT No.: PCT/CN2016/111818
§ 371 (c)(1),
(2) Date: Apr. 19, 2018

(87) PCT Pub. No.: WO2017/114319
PCT Pub. Date: Jul. 6, 2017

(65) Prior Publication Data
US 2018/0316361 A1 Nov. 1, 2018

(30) Foreign Application Priority Data

Dec. 30, 2015 (CN) .......................... 2015 1 1010861

(51) Int. Cl.
*H03M 1/12* (2006.01)
*G05B 19/042* (2006.01)
(52) U.S. Cl.
CPC ........ *H03M 1/1225* (2013.01); *G05B 19/042* (2013.01); *H03M 1/12* (2013.01)

(58) Field of Classification Search
CPC ...... H03M 1/1225; H03M 1/12; G05B 19/042
(Continued)

(56) References Cited

U.S. PATENT DOCUMENTS

| 4,296,324 A | 10/1981 | Kern et al. |
| 7,558,157 B1 | 7/2009 | Gardner et al. |

(Continued)

FOREIGN PATENT DOCUMENTS

| CN | 2189742 Y | 2/1995 |
| CN | 2 291 965 A | 2/1996 |

(Continued)

OTHER PUBLICATIONS

Chinese Office Action issued in Chinese Patent Application No. 201511010861.9 dated Jul. 31, 2017.
(Continued)

*Primary Examiner* — Brian Young
(74) *Attorney, Agent, or Firm* — Arent Fox LLP

(57) ABSTRACT

A dual-sensor signal collecting circuit comprises circuit (11), a second sensor signal collecting circuits, an AD sampling circuit, an AND gate determination circuit and a collected signal averaging circuit. Output ends of the sensor signal collecting circuits are connected to respective input ends of the AND gate determination circuit, respective input ends of the collected signal averaging circuit and a first AD sampling port of the AD sampling circuit; an output end of the AND gate determination circuit is connected to a power supply end of the collected signal averaging circuit; an output end of the collected signal averaging circuit is connected to the first AD sampling port of the AD sampling circuit. When the sensors operate normally, the collected signal averaging circuit outputs an average sampling value
(Continued)

to the first AD sampling port, when one is damaged, a sampling value of the one operating normally is output to the first AD sampling port.

9 Claims, 3 Drawing Sheets

(58) Field of Classification Search
USPC .................................................. 341/155, 120
See application file for complete search history.

(56) References Cited

U.S. PATENT DOCUMENTS

| | | | | |
|---|---|---|---|---|
| 8,884,629 B1 * | 11/2014 | Kumar | ................... | H03F 1/0277 |
| | | | | 324/523 |
| 8,941,528 B2 * | 1/2015 | Yun | .................... | H04N 5/37455 |
| | | | | 341/155 |
| 9,000,966 B2 * | 4/2015 | Sohn | ...................... | H04N 5/378 |
| | | | | 341/155 |
| 2008/0084344 A1 | 4/2008 | Posamentier | | |

FOREIGN PATENT DOCUMENTS

| | | |
|---|---|---|
| CN | 2753936 Y | 1/2006 |
| CN | 201876272 U | 6/2011 |
| CN | 102393224 A | 3/2012 |
| CN | 102539813 A | 7/2012 |
| CN | 203644368 U | 6/2014 |
| CN | 104122814 A | 10/2014 |
| CN | 204847935 U | 12/2015 |
| CN | 105356880 A | 2/2016 |
| CN | 105425685 A | 3/2016 |
| CN | 205375079 U | 7/2016 |
| JP | H09258905 | 10/1997 |
| WO | WO 81/01330 A1 | 5/1981 |

OTHER PUBLICATIONS

International Search Report and Written Opinion issued in PCT/CN2016/111818 dated Mar. 1, 2017.

\* cited by examiner

DUAL-SENSOR SIGNAL COLLECTING CIRCUIT

CROSS-REFERENCE TO RELATED APPLICATIONS

This application is a National Stage entry of International Application No.: PCT/CN2016/111818, filed on Dec. 23, 2016, which claims priority to Chinese Patent Application No. 201511010861.9, filed on Dec. 30, 2015. The disclosure of the priority applications are hereby incorporated in their entirety by reference.

TECHNICAL FIELD

The application pertains to the technical field of circuit design, and particularly pertains to a dual-sensor signal collecting circuit.

BACKGROUND

In the prior art, collecting a signal is typically collected by one AD sampling port assigned by an AD sampling circuit or chip that is sensed by a sensor. However, if the circuit has only one sensor and the sensor is damaged, the failure to collect the signal will cause irretrievable losses.

In order to solve the above problem, two sensors may be used in parallel to simultaneously collect a signal. For example, two methane gas sensors are used to simultaneously collect the gas concentration signal at a certain position, and when one sensor is damaged, the other sensor can still normally operate to collect the signal. Although such a method can increase the reliability, the AD sampling circuit or chip must assign two AD sampling ports to collect two sensor signals respectively, and thus more AD resources which are not rich will be used.

SUMMARY

The present application provides a dual-sensor signal collecting circuit to solve the technical problem in the prior art that too many AD sampling ports will be used in order to ensure the stability of a sensor circuit.

In order to solve the above technical problem, the present application provides the following technical solutions:

A dual-sensor signal collecting circuit, comprising a signal collecting circuit and an AD sampling circuit, wherein the dual-sensor signal collecting circuit further comprises an AND gate judging circuit and a collected signal averaging circuit, and the signal collecting circuit comprises a first sensor signal collecting circuit and a second sensor signal collecting circuit. An output end of the first sensor signal collecting circuit is connected to a first input end of the AND gate judging circuit, and an output end of the second sensor signal collecting circuit is connected to a second input end of the AND gate judging circuit; and an output end of the AND gate judging circuit is connected to a power supply end of the collected signal averaging circuit. The output end of the first sensor signal collecting circuit is further connected to a first input end of the collected signal averaging circuit, and the output end of the second sensor signal collecting circuit is further connected to a second input end of the collected signal averaging circuit. An output end of the collected signal averaging circuit is connected to a first AD sampling port of the AD sampling circuit. Both the output end of the first sensor signal collecting circuit and the output end of the second sensor signal collecting circuit are further connected to the first AD sampling port of the AD sampling circuit.

Optionally, the first sensor signal collecting circuit comprises a first sensor, a first switching circuit and a first signal amplifying circuit; an output end of the first sensor is connected to an input end of the first signal amplifying circuit; the first switching circuit comprises a first switching tube and a second switching tube; an output end of the first signal amplifying circuit is connected to an input end of the first switching tube, and an output end of the first switching tube is connected to the first input end of the AND gate judging circuit; the output end of the first sensor is connected to a first input end of the second switching tube; and an output end of the second switching tube is connected to the first AD sampling port. The second sensor signal collecting circuit comprises a second sensor, a second switching circuit and a second signal amplifying circuit; an output end of the second sensor is connected to an input end of the second signal amplifying circuit; the second switching circuit comprises a third switching tube and a fourth switching tube; an output end of the second signal amplifying circuit is connected to an input end of the third switching tube, and an output end of the third switching tube is connected to the second input end of the AND gate judging circuit; the output end of the second sensor is connected to a first input end of the fourth switching tube; and an output end of the fourth switching tube is connected to the first AD sampling port; and a second input end of the second switching tube is connected to the output end of the third switching tube; and a second input end of the fourth switching tube is connected to the output end of the first switching tube.

Optionally, the first sensor signal collecting circuit further comprises a first sensor configuring circuit; the first sensor configuring circuit comprises a first resistor, a second resistor, a third resistor and a first potentiometer; one end of the first resistor is connected to an electric power supply, and the other end is connected to the first potentiometer; one end of the second resistor is connected to the electric power supply, the other end is connected to one end of the third resistor, and the other end of the third resistor is grounded; and a power supply end of the first sensor is connected between the second resistor and the third resistor; and the second sensor signal collecting circuit further comprises a second sensor configuring circuit; the second sensor configuring circuit comprises a fourth resistor, a fifth resistor, a sixth resistor and a second potentiometer; one end of the fourth resistor is connected to the electric power supply, and the other end is connected to the second potentiometer; one end of the fifth resistor is connected to the electric power supply, the other end is connected to one end of the sixth resistor, and the other end of the sixth resistor is grounded; and a power supply end of the second sensor is connected between the fifth resistor and the sixth resistor.

Optionally, the first signal amplifying circuit comprises a first amplifier; a first input end of the first amplifier is connected to an output end of the first potentiometer, and a second input end of the first amplifier is connected to the output end of the first sensor; an output end of the first amplifier is connected to the input end of the first switching tube; and a first filter capacitor is connected in series between the first input end and the output end of the first amplifier; and the second signal amplifying circuit comprises a second amplifier; a first input end of the second amplifier is connected to an output end of the second potentiometer, and a second input end of the second amplifier is connected to the output end of the second sensor; an output end of the second amplifier is connected to an input end of the second switching tube; and a second filter capacitor is connected in series between the first input end and the output end of the second amplifier.

Optionally, the AND gate judging circuit comprises a first diode, a second diode, a stabilivolt and a fifth switching tube; and a cathode of the first diode is connected to the output end of the first switching tube, and a cathode of the second diode is connected to the output end of the third switching tube; an anode of the first diode and an anode of the second diode are in communication, and are connected to the electric power supply via a pull-up resistor; an first input end of the fifth switching tube is connected to the anodes of the first diode and the second diode, a second input end is connected to the electric power supply, and an output end is grounded via a pull-down resistor; a cathode of the stabilivolt is connected to the anodes of the first diode and the second diode; and an anode of the stabilivolt is grounded.

Optionally, the collected signal averaging circuit comprises a third amplifier and a fourth amplifier; a first input end of the third amplifier is grounded, and a second input end of the third amplifier is connected to both the output end of the first switching tube and the output end of the third switching tube; and a second input end of the third amplifier is further connected to an output end of the third amplifier via a series resistor; an output end of the third amplifier is further connected to a second input end of the fourth amplifier; a first input end of the fourth amplifier is grounded; a second input end of the fourth amplifier is further connected to an output end of the fourth amplifier via a series resistor; an output end of the fourth amplifier is connected to the first AD sampling port; and the first AD sampling port of the AD sampling circuit is connected to a pull-down resistor; and an output end of the fifth switching tube is connected to power supply ends of the third amplifier and the fourth amplifier.

Optionally, the first amplifier is a comparator. The first input end of the first amplifier is a non-inverting input end of the comparator, and the second input end of the first amplifier is an inverting input end of the comparator; and the output end of the first amplifier is an output end of the comparator. The second amplifier is a comparator. The first input end of the second amplifier is a non-inverting input end of the comparator, the second input end of the second amplifier is an inverting input end of the comparator, and the output end of the second amplifier is an output end of the comparator.

Optionally, the first switching tube and the third switching tube are NMOS field effect transistors; and the input ends of the first switching tube and the third switching tube are gates and drains of the NMOS field effect transistors, and the output ends of the first switching tube and the third switching tube are sources of the NMOS field effect transistors. The second switching tube and the fourth switching tube are PMOS field effect transistors; the first input ends of the second switching tube and the fourth switching tube are gates of the PMOS field effect transistors; the second input ends of the second switching tube and the fourth switching tube are drains of the PMOS field effect transistors; and the output ends of the second switching tube and the fourth switching tube are sources of the PMOS field effect transistors.

Optionally, both the first sensor and the second sensor are gas sensors.

Compared with the prior art, the merits and advantageous effects of the present application are as follows. In the dual-sensor signal collecting circuit according to the present application, two sensor signal collecting circuits share one AD sampling port of the AD sampling circuit. The AND gate judging circuit judges the operating state of the two sensor signal collecting circuits, and when the two sensor signal collecting circuits operate normally, an electric power supply is provided to the collected signal averaging circuit, so that the signals collected by the two sensors are averaged and outputted by the collected signal averaging circuit, thereby the outputted collected signal is more stable and accurate. When a sensor signal collecting circuit is damaged and stops operating, the providing of an electric power supply to the collected signal averaging circuit is stopped, so that the collected signal averaging circuit stops operating, and the signal collected by the sensor signal collecting circuit which operates normally is outputted to the first AD sampling port. Moreover, by adding the AND gate judging circuit and the collected signal averaging circuit in the circuit, one AD sampling port is shared by two sensor signal collecting circuits, and the stability of sensor signal collecting can be ensured. Compared with the prior art in which two sensors must use two AD sampling ports, the present disclosure solves the technical problem in the prior art that too many AD sampling ports will be used to ensure the stability of a sensor circuit.

Other characteristics and advantages of the present application will become clearer by reading the detailed description of the embodiments of the present application with reference to the drawings.

DETAILED DESCRIPTION

Figure 1:
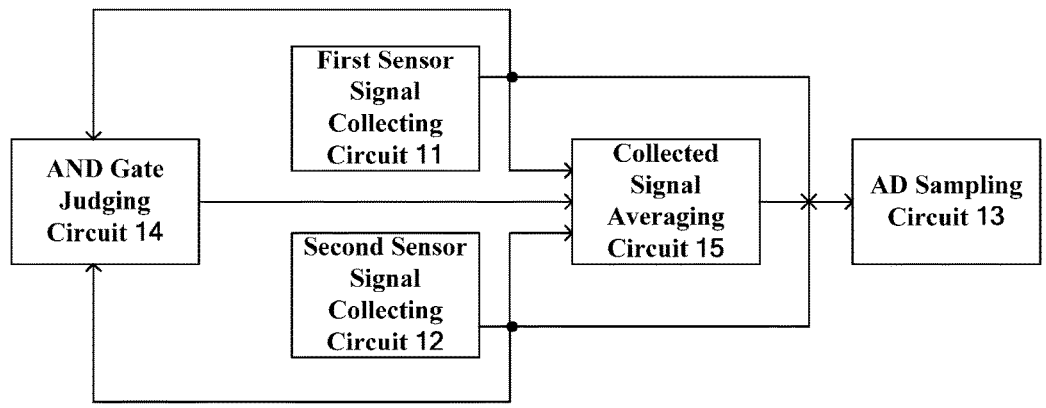
FIG. 1 is a circuit architecture diagram of a dual-sensor signal collecting circuit according to an embodiment of the present application.

The particular embodiments of the present application will be further described in detail by referring to the drawings.

FIG. 1 is a circuit architecture diagram of a dual-sensor signal collecting circuit according to an embodiment of the present application. As shown in FIG. 1, it comprises a first sensor signal collecting circuit 11, a second sensor signal collecting circuit 12, an AD sampling circuit 13, an AND gate judging circuit 14 and a collected signal averaging circuit 15.

The output end of the first sensor signal collecting circuit 11 is connected to the first input end of the AND gate judging circuit 14; the output end of the second sensor signal collecting circuit 12 is connected to the second input end of the AND gate judging circuit 14; the output end of the AND gate judging circuit 14 is connected to the power supply end of the collected signal averaging circuit 15.

The output end of the first sensor signal collecting circuit 11 is further connected to the first input end of the collected signal averaging circuit 15; the output end of the second sensor signal collecting circuit 12 is further connected to the second input end of the collected signal averaging circuit 15; the output end of the collected signal averaging circuit 15 is connected to the first AD sampling port AD of the AD sampling circuit 13.

Both the output end of the first sensor signal collecting circuit 11 and the output end of the second sensor signal collecting circuit 12 are further connected to the first AD sampling port of the AD sampling circuit 13.

As stated above, the first sensor signal collecting circuit 11 and the second sensor signal collecting circuit 12 share one AD sampling port of the AD sampling circuit, namely, the first AD sampling port. The AND gate judging circuit 14 judges the operating state of the two sensor signal collecting circuits. When the two sensor signal collecting circuits operate normally, an electric power supply is provided to the collected signal averaging circuit 15, so that the collected signal averaging circuit 15 averages the two signals that are collected by the two sensor signal collecting circuits and outputs, thereby the collected signal obtained is more stable and accurate. When one of the two sensor signal collecting circuits is damaged and stops operating, the providing of the electric power supply to the collected signal averaging circuit 15 is stopped, so that the collected signal averaging circuit 15 stops operating, thereby the signal collected by the sensor signal collecting circuit which operates normally is outputted to the first AD sampling port.

In the present disclosure, by adding the AND gate judging circuit 14 and the collected signal averaging circuit 15 in the circuit, one AD sampling port is shared by two sensor signal collecting circuits, and the stability of sensor signal collecting can be ensured. Compared with the prior art in which two sensors must use two AD sampling ports, the present disclosure solves the technical problem in the prior art that too many AD sampling ports will be used to ensure the stability of a sensor circuit.

Figure 2:
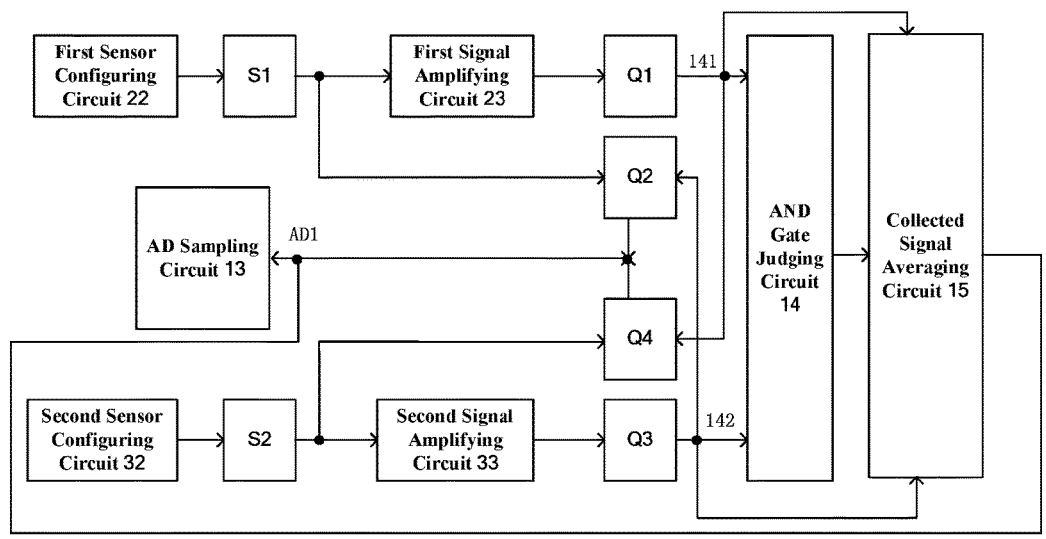
FIG. 2 is a circuit diagram of a first sensor signal collecting circuit and a second sensor signal collecting circuit according to an embodiment of the present application.

As shown in FIG. 2, in a particular example of the first sensor signal collecting circuit 11, it comprises a first sensor S1, a first sensor configuring circuit 22, a first switching circuit and a first signal amplifying circuit 23. The output end of the first sensor S1 is connected to the input end of the first signal amplifying circuit 23. The first switching circuit comprises a first switching tube Q1 and a second switching tube Q2 The output end of the first signal amplifying circuit 23 is connected to the input end of the first switching tube Q1; the output end of the first switching tube Q1 is connected to a first input end 141 of the AND gate judging circuit 14; the output end of the first sensor S1 is connected to the first input end of the second switching tube Q2; the output end of the second switching tube Q2 is connected to a first AD sampling port AD1 of the AD sampling circuit 13.

As shown in FIG. 2, like the first sensor signal collecting circuit 11, the second sensor signal collecting circuit 12 comprises a second sensor S2, a second sensor configuring circuit 32, a second switching circuit and a second signal amplifying circuit 33. The output end of the second sensor S2 is connected to the input end of the second signal amplifying circuit 33. The second switching circuit comprises a third switching tube Q3 and a fourth switching tube Q4. The output end of the second signal amplifying circuit 33 is connected to the input end of the third switching tube Q3, the output end of the third switching tube Q3 is connected to a second input end 142 of the AND gate judging circuit 14; the output end of the second sensor S2 is connected to the first input end of the fourth switching tube Q4; the output end of the fourth switching tube Q4 is connected to the first AD sampling port AD1 of the AD sampling circuit 13.

The second input end of the second switching tube Q2 is connected to the output end of the third switching tube Q3; the second input end of the fourth switching tube Q4 is connected to the output end of the first switching tube Q1.

In FIG. 2, when the first switching tube is an NMOS field effect transistor, the input end of the first switching tube Q1 is the gate and the drain of the NMOS field effect transistor, and the output end of the first switching tube Q1 is the source of the NMOS field effect transistor. When the second switching tube Q2 is a PMOS field effect transistor, the first input end of the second switching tube Q2 is the gate of the PMOS field effect transistor, the second input end of the second switching tube Q2 is the drain of the PMOS field effect transistor, and the output end of the second switching tube is the source of the PMOS field effect transistor.

In FIG. 2, when the third switching tube is an NMOS field effect transistor, the input end of the third switching tube is the gate and the drain of the NMOS field effect transistor, and the output end of the third switching tube is the source of the NMOS field effect transistor; and when the fourth switching tube is a PMOS field effect transistor, the first input end of the fourth switching tube is the gate of the PMOS field effect transistor, the second input end of the fourth switching tube is the drain of the PMOS field effect transistor, and the output end of the fourth switching tube is the source of the PMOS field effect transistor.

Figure 3:
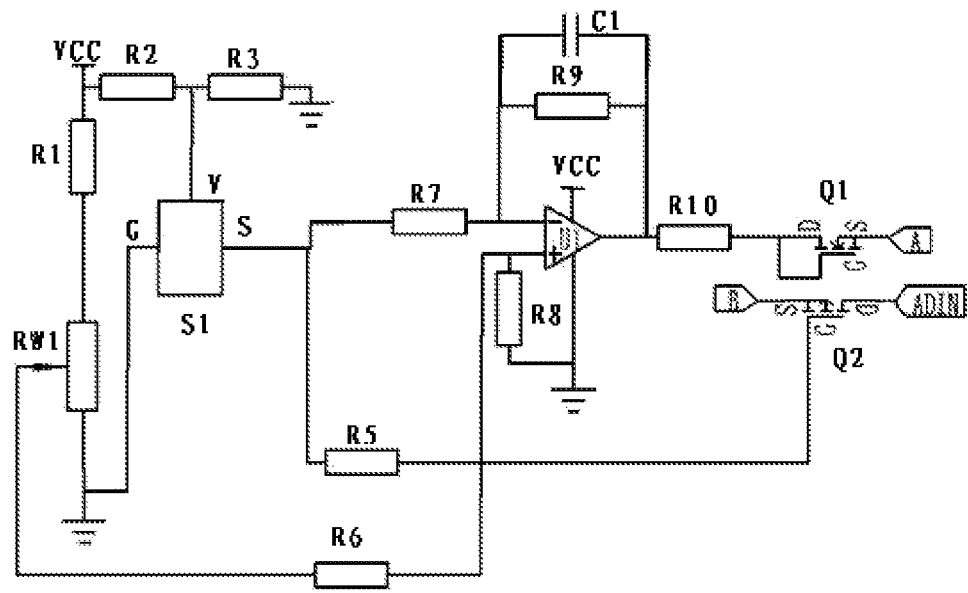
FIG. 3 is a particular example of a circuit diagram of a first signal amplifying circuit and a first sensor configuring circuit according to an embodiment of the present application.

In a particular embodiment as shown in FIG. 3, the first sensor configuring circuit 22 comprises a first resistor R1, a second resistor R2, a third resistor R3 and a first potentiometer RW1. One end of the first resistor R1 is connected to an electric power supply VCC, and the other end is connected to the input end of the first potentiometer RW1; one end of the second resistor R2 is connected to the electric power supply VCC, the other end is connected to one end of the third resistor R3, and the other end of the third resistor R3 is grounded; the connected ends of the second resistor R2 and the third resistor R3 are connected to the power supply end of the first sensor S1.

Figure 4:
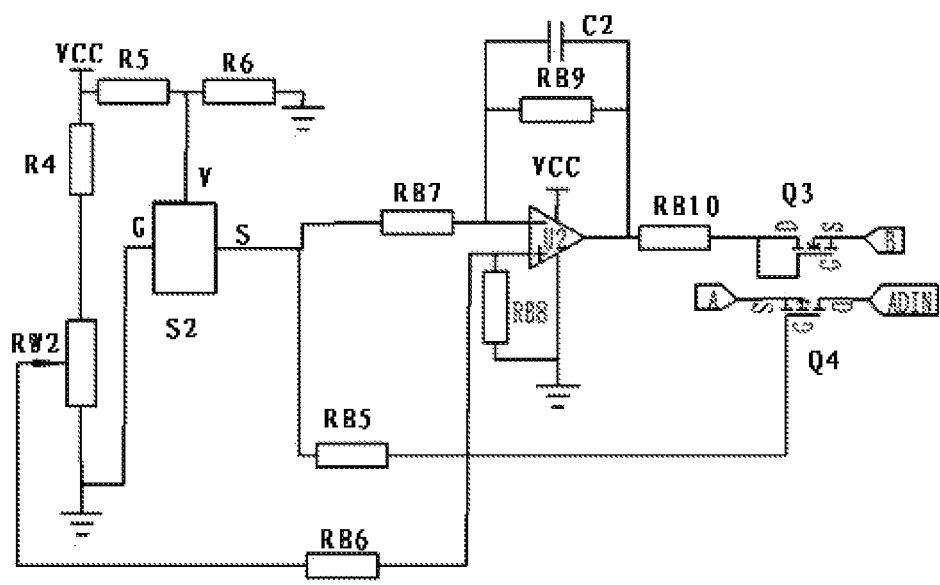
FIG. 4 is a particular example of a circuit diagram of a second signal amplifying circuit and a second sensor configuring circuit according to an embodiment of the present application.

As shown in FIG. 4, the second sensor configuring circuit 32 comprises a fourth resistor R4, a fifth resistor R5, a sixth resistor R6 and a second potentiometer RW2. One end of the fourth resistor R4 is connected to the electric power supply VCC, and the other end is connected to the second potentiometer RW2; one end of the fifth resistor R5 is connected to the electric power supply VCC, the other end is connected to one end of the sixth resistor R6, and the other end of the sixth resistor R6 is grounded; the connected ends of the fifth resistor R5 and the sixth resistor R6 are connected to the power supply end of the second sensor S2.

As shown in FIG. 3, the first signal amplifying circuit 23 comprises a first amplifier U1. The first input end of the first amplifier U1 is connected to the output end of the first potentiometer RW1, so that the voltage that is outputted by the first potentiometer RW1 is used as the amplifier reference voltage that is inputted into the first input end of the first amplifier U1. The other end of the first potentiometer RW1 is grounded. The second input end of the first amplifier U1 is connected to an output end S of the first sensor S1; the output end of the first amplifier U1 is connected to the input end of the first switching tube Q1; a first filter capacitor C1 is connected in series between the first input end and the output end of the first amplifier U1.

In FIG. 3, the first amplifier U1 is a comparator. The first input end of the first amplifier U1 is the non-inverting input end of the comparator, and the second input end of the first amplifier U1 is the inverting input end of the comparator; and the output end of the first amplifier U1 is the output end of the comparator. A resistor R7 is connected in series between the first input end of the first amplifier U1 and the output end of the first sensor; the second input end of the first amplifier U1 is grounded and further connected to a pull-down resistor R8; the first filter capacitor C1 is further connected in parallel to a resistor R9; a resistor R10 is connected in series between the output end of the first amplifier U1 and the input end of the first switching tube Q1.

As shown in FIG. 4, the second signal amplifying circuit 33 comprises a second amplifier U2. The first input end of the second amplifier U2 is connected to the output end of the second potentiometer RW2, so that the voltage that is outputted by the second potentiometer RW2 is used as the amplifier reference voltage that is inputted into the first input end of the second amplifier U2. The other end of the second potentiometer RW2 is grounded. The second input end of the second amplifier U2 is connected to the output end of the second sensor S2; the output end of the second amplifier U2 is connected to the input end of the second switching tube Q2; a second filter capacitor C2 is connected in series between the first input end and the output end of the second amplifier U2.

In FIG. 4, the second amplifier U2 is a comparator, the first input end of the second amplifier U2 is the non-inverting input end of the comparator, the second input end of the second amplifier U2 is the inverting input end of the comparator, and the output end of the second amplifier U2 is the output end of the comparator. A resistor RB7 is connected in series between the first input end of the second amplifier U2 and the output end of the second sensor; the second input end of the second amplifier U2 is grounded and further connected to a pull-down resistor RB8; the second filter capacitor C2 is further connected in parallel to a resistor RB9; a resistor RB10 is connected in series between the output end of the second amplifier U2 and the input end of the third switching tube Q3.

Figure 5:
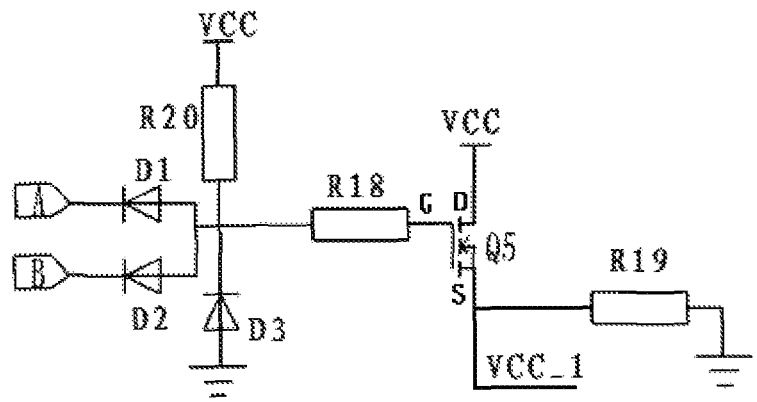
FIG. 5 is a particular example of a circuit diagram of a AND gate judging circuit according to an embodiment of the present application.

As shown in FIG. 5, the AND gate judging circuit 14 comprises a first diode D1, a second diode D2, a stabilivolt D3 and a fifth switching tube Q5. The cathode of the first diode D1 is connected to the output end of the first switching tube Q1, and the cathode of the second diode D2 is connected to the output end of the third switching tube Q3; the anode of the first diode D1 and the anode of the second diode D2 are connected, and are connected to the electric power supply VCC via a pull-up resistor R20; the cathode of the stabilivolt D3 is connected to the anodes of the first diode D1 and the second diode D2, and the cathode of the stabilivolt D3 is grounded. The first input end of the fifth switching tube Q5 is connected to the anodes of the first diode D1 and the second diode D2, the second input end is connected to the electric power supply VCC, and the output end is grounded via a pull-down resistor R19. In FIG. 5, the fifth switching tube Q5 is an NMOS field effect transistor. The first input end of the fifth switching tube Q5 is the gate of the NMOS field effect transistor and connected to the anodes of the first diode D1 and the second diode D2 via a series resistor R18; the second input end of the fifth switching tube Q5 is the drain of the NMOS field effect transistor; the output end of the fifth switching tube Q5 is the source of the NMOS field effect transistor; the output voltage of the source end, as the output end of the AND gate judging circuit, is connected to a power supply end VCC_1 of the collected signal averaging circuit 15.

Figure 6:
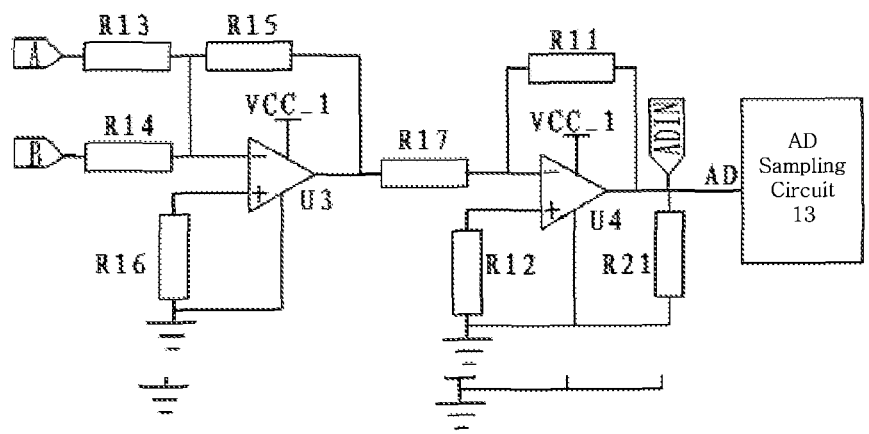
FIG. 6 is a particular example of a circuit diagram of a collected signal averaging circuit according to an embodiment of the present application.

As shown in FIG. 6, the collected signal averaging circuit 15 comprises a third amplifier U3 and a fourth amplifier U4. The first input end of the third amplifier U3 is grounded via a pull-down resistor R16; the second input end of the third amplifier U3 is connected to both the output end of the first switching tube Q1 and the output end of the third switching tube Q3; the second input end of the third amplifier U3 is further connected to the output end of the third amplifier U3 via a series resistor R15. The output end of the third amplifier U3 is further connected to the second input end of the fourth amplifier U4; the first input end of the fourth amplifier U4 is grounded via a pull-down resistor R12; the second input end of the fourth amplifier U4 is further connected to the output end via a series resistor R11; the output end of the fourth amplifier U4 is connected to the first AD sampling port AD; the first AD sampling port AD of the AD sampling circuit 13 is connected to a pull-down resistor R21; the output end of the fifth switching tube Q5 is connected to the power supply ends of the third amplifier U3 and the fourth amplifier U4, to provide the power supply VCC_1 for the third amplifier U3 and the fourth amplifier U4.

In FIG. 6, the third amplifier U3 is a comparator, the first input end of the third amplifier U3 is the non-inverting input end of the comparator, the second input end of the third amplifier U3 is the inverting input end of the comparator, and the output end of the third amplifier U3 is the output end of the comparator The fourth amplifier U4 is a comparator, the first input end of the fourth amplifier U4 is the non-inverting input end of the comparator, the second input end of the fourth amplifier U4 is the inverting input end of the comparator, and the output end of the fourth amplifier U4 is the output end of the comparator. The power supply of the third amplifier U3 and the fourth amplifier U4 is provided by the source output VCC_1 of the fifth switching tube Q5.

The operations of the above particular circuits shown in FIGS. 2 to 7 will be described in detail by taking the case that both the first sensor and the second sensor are gas sensors as an example.

When both the first sensor S1 and the second sensor S2 operate normally, for example, in the first sensor signal collecting circuit 11, the PMOS field effect transistor of the second switching tube Q2 is turned off since it has a gate voltage greater than zero and does not satisfy the turning-on requirement; similarly, the fourth switching tube Q4 in the second sensor signal collecting circuit 12 is also turned off, so the two inductive signals cannot be outputted directly to the first AD sampling port of the AD sampling circuit 13. After the two gas concentration inductive signals are amplified by the first amplifier U1 and the second amplifier U2 respectively, the NMOS field effect transistors of the first switching tube Q1 and the third switching tube Q3 satisfy the turning-on requirement, so the two inductive signals after amplified are outputted to the first input end and the second input end of the AND gate judging circuit 14 respectively.

When both of the two input ends of the AND gate judging circuit 14 are at a high level, a forward voltage is applied to the cathodes of the first diode D1 and the second diode D2, and they are both turned off; the gate of the fifth switching tube Q5 is at a high level and thus turned on, so the source output voltage VCC_1 is applied to the third amplifier U3 and the fourth amplifier U4 of the collected signal averaging circuit 15, thereby enabling the third amplifier U3 and the fourth amplifier U4 to start to operate, namely, enabling the collected signal averaging circuit 15 to operate normally and output the average value of the two inductive signals.

If the first sensor S1 or the second sensor S2 is damaged, for example, the first sensor S1 is damaged and the second sensor S2 operates normally, at this point, the signal level outputted by the first sensor S1 is zero, so the first switching tube Q1 is turned off while the second switching tube Q2 is turned on. On the other hand, the second sensor S2 outputs a gas inductive signal at a high level, so the third switching tube Q3 is turned on while the fourth switching tube Q4 is turned off. Thereby the gas inductive signal obtained by the second sensor S2 is amplified and then outputted from the output end of the third switching tube Q3.

At this point, the input of the first input end of the AND gate judging circuit 14 is zero, and the input of the second input end is at a high level, so the first diode D1 is turned on. The gate voltage of the fifth switching tube Q5 is the anode voltage of the first diode D1 and is approximately zero, so the Q5 is turned off, and the source output is zero. The third amplifier U3 and the fourth amplifier U4 in the collected signal averaging circuit 15 stop operating due to not having working voltages and thus do not have outputs, so the gas inductive signal collected by the second sensor S2 is outputted to the first AD sampling port of the AD sampling circuit 13 via the conducted second switching tube Q2.

If the first sensor S1 operates normally and the second sensor S2 is damaged, similarly to the case above, finally, the gas inductive signal collected by the first sensor S1 is outputted to the first AD sampling port of the AD sampling circuit 13 via the conducted fourth switching tube Q4.

Therefore, according to the present disclosure, when a sensor is damaged, it will automatically switch to sampling the gas concentration signal collected by the gas sensor which operates normally, thereby ensuring the stability of the sampling circuit by using only one AD sampling port.

As stated above, the dual-sensor signal collecting circuit according to the present application uses only one AD sampling port of the AD sampling circuit to collect two sensor inductive signals simultaneously. Namely, when both the two sensors operate normally, based on the judgment of the AND gate judging circuit 14, a working voltage is provided to the collected signal averaging circuit 15, so that the signals collected by the two sensors are averaged and outputted by the collected signal averaging circuit 15, and then collected by the first AD sampling port of the AD sampling circuit 13, thereby the outputted collected signal is more stable and accurate. When a sensor is damaged, based on the judgment of the AND gate judging circuit 14, the providing of the working voltage to the collected signal averaging circuit 15 is stopped, so that the collected signal averaging circuit 15 stops operating, and the signal sensed by the sensor which operates normally is outputted to the first AD sampling port of the AD sampling circuit 13, thereby the circuit automatically selects the signal of the sensor which operates normally. Consequently, the present disclosure avoids the loss caused by sensor damaging, reduces the number of the AD sampling ports of the AD sampling circuit being used while ensuring the stability of the circuit, and improves the resource utilization rate of the AD sampling ports, which are not rich, of the AD sampling circuit or AD sampling chips.

In the above embodiments of the present application, both the collected signal averaging circuit 15 and the AND gate judging circuit 14 are implemented by devices such as resistors, amplifiers and MOS tubes, so they have high practical applicability, low manufacturing cost and high circuit stability, and save the AD resource, and thus are suitable for extensive use.

It should be noted that, the above description is not intended to limit the present disclosure, and the present disclosure is not limited to the above examples. The variations, modifications, additions or replacements made by a person skilled in the art without departing from the spirit and scope of the present disclosure are also within the protection scope of the present disclosure.

What is claimed is:

1. A dual-sensor signal collecting circuit, comprising a signal collecting circuit and an AD sampling circuit, wherein the dual-sensor signal collecting circuit further comprises an AND gate judging circuit and a collected signal averaging circuit, the signal collecting circuit comprises a first sensor signal collecting circuit and a second sensor signal collecting circuit;

an output end of the first sensor signal collecting circuit is connected to a first input end of the AND gate judging circuit, and an output end of the second sensor signal collecting circuit is connected to a second input end of the AND gate judging circuit; and an output end of the AND gate judging circuit is connected to a power supply end of the collected signal averaging circuit;

the output end of the first sensor signal collecting circuit is further connected to a first input end of the collected signal averaging circuit, and the output end of the second sensor signal collecting circuit is further connected to a second input end of the collected signal averaging circuit; and an output end of the collected signal averaging circuit is connected to a first AD sampling port of the AD sampling circuit; and both the output end of the first sensor signal collecting circuit and the output end of the second sensor signal collecting circuit are further connected to the first AD sampling port of the AD sampling circuit;

the AND gate judging circuit judges the operating state of the first sensor signal collecting circuit and the second sensor signal collecting circuit, and when the two sensor signal collecting circuits operate normally, an electric power supply is provided to the collected signal averaging circuit, so that the signals collected by the two sensors are averaged and outputted by the collected signal averaging circuit, and when a sensor signal collecting circuit is damaged and stops operating, the providing of an electric power supply to the collected signal averaging circuit is stopped, so that the collected signal averaging circuit stops operating, and the signal collected by the sensor signal collecting circuit which operates normally is outputted to the first AD sampling port.

2. The dual-sensor signal collecting circuit according to claim 1, wherein the first sensor signal collecting circuit comprises a first sensor, a first switching circuit and a first signal amplifying circuit; an output end of the first sensor is connected to an input end of the first signal amplifying circuit; the first switching circuit comprises a first switching tube and a second switching tube; an output end of the first signal amplifying circuit is connected to an input end of the first switching tube, and an output end of the first switching tube is connected to the first input end of the AND gate judging circuit; the output end of the first sensor is connected to a first input end of the second switching tube; and an output end of the second switching tube is connected to the first AD sampling port;

the second sensor signal collecting circuit comprises a second sensor, a second switching circuit and a second signal amplifying circuit; an output end of the second sensor is connected to an input end of the second signal amplifying circuit; the second switching circuit comprises a third switching tube and a fourth switching tube; an output end of the second signal amplifying circuit is connected to an input end of the third switching tube, and an output end of the third switching tube is connected to the second input end of the AND gate judging circuit; the output end of the second sensor is connected to a first input end of the fourth switching tube; and an output end of the fourth switching tube is connected to the first AD sampling port; and a second input end of the second switching tube is connected to the output end of the third switching tube; and a second input end of the fourth switching tube is connected to the output end of the first switching tube.

3. The dual-sensor signal collecting circuit according to claim 2, wherein the first sensor signal collecting circuit further comprises a first sensor configuring circuit; the first sensor configuring circuit comprises a first resistor, a second resistor, a third resistor and a first potentiometer; one end of the first resistor is connected to an electric power supply, and the other end is connected to the first potentiometer; one end of the second resistor is connected to the electric power supply, the other end is connected to one end of the third resistor, and the other end of the third resistor is grounded; and a power supply end of the first sensor is connected between the second resistor and the third resistor; and the second sensor signal collecting circuit further comprises a second sensor configuring circuit; the second sensor configuring circuit comprises a fourth resistor, a fifth resistor, a sixth resistor and a second potentiometer; one end of the fourth resistor is connected to the electric power supply, and the other end is connected to the second potentiometer; one end of the fifth resistor is connected to the electric power supply, the other end is connected to one end of the sixth resistor, and the other end of the sixth resistor is grounded; and a power supply end of the second sensor is connected between the fifth resistor and the sixth resistor.

4. The dual-sensor signal collecting circuit according to claim 3, wherein the first signal amplifying circuit comprises a first amplifier; a first input end of the first amplifier is connected to an output end of the first potentiometer, and a second input end of the first amplifier is connected to the output end of the first sensor; an output end of the first amplifier is connected to the input end of the first switching tube; and a first filter capacitor is connected in series between the first input end and the output end of the first amplifier; and the second signal amplifying circuit comprises a second amplifier; a first input end of the second amplifier is connected to an output end of the second potentiometer, and a second input end of the second amplifier is connected to the output end of the second sensor; an output end of the second amplifier is connected to an input end of the second switching tube; and a second filter capacitor is connected in series between the first input end and the output end of the second amplifier.

5. The dual-sensor signal collecting circuit according to claim 2, wherein the AND gate judging circuit comprises a first diode, a second diode, a stabilivolt and a fifth switching tube; and a cathode of the first diode is connected to the output end of the first switching tube, and a cathode of the second diode is connected to the output end of the third switching tube; an anode of the first diode and an anode of the second diode are in communication, and are connected to the electric power supply via a pull-up resistor; an first input end of the fifth switching tube is connected to the anodes of the first diode and the second diode, a second input end is connected to the electric power supply, and an output end is grounded via a pull-down resistor; a cathode of the stabilivolt is connected to the anodes of the first diode and the second diode; and an anode of the stabilivolt is grounded.

6. The dual-sensor signal collecting circuit according to claim 5, wherein the collected signal averaging circuit comprises a third amplifier and a fourth amplifier;

a first input end of the third amplifier is grounded, and a second input end of the third amplifier is connected to both the output end of the first switching tube and the output end of the third switching tube; and the second input end of the third amplifier is further connected to an output end of the third amplifier via a series resistor;

an output end of the third amplifier is further connected to a second input end of the fourth amplifier; a first input end of the fourth amplifier is grounded; the second input end of the fourth amplifier is further connected to an output end of the fourth amplifier via a series resistor; an output end of the fourth amplifier is connected to the first AD sampling port; and the first AD sampling port of the AD sampling circuit is connected to a pull-down resistor; and an output end of the fifth switching tube is connected to power supply ends of the third amplifier and the fourth amplifier.

7. The dual-sensor signal collecting circuit according to claim 4, wherein the first amplifier is a comparator, the first input end of the first amplifier is a non-inverting input end of the comparator, and the second input end of the first amplifier is an inverting input end of the comparator; and the output end of the first amplifier is an output end of the comparator; and the second amplifier is a comparator, the first input end of the second amplifier is a non-inverting input end of the comparator, the second input end of the second amplifier is an inverting input end of the comparator, and the output end of the second amplifier is an output end of the comparator.

8. The dual-sensor signal collecting circuit according to claim 2, wherein the first switching tube and the third switching tube are NMOS field effect transistors; and the input ends of the first switching tube and the third switching tube are gates and drains of the NMOS field effect transistors, and the output ends of the first switching tube and the third switching tube are sources of the NMOS field effect transistors; and the second switching tube and the fourth switching tube are PMOS field effect transistors; the first input ends of the second switching tube and the fourth switching tube are gates of the PMOS field effect transistors; the second input ends of the second switching tube and the fourth switching tube are drains of the PMOS field effect transistors; and the output ends of the second switching tube and the fourth switching tube are sources of the PMOS field effect transistors.

9. The dual-sensor signal collecting circuit according to claim 2, wherein both the first sensor and the second sensor are gas sensors.

* * * * *